United States Patent [19]

Sugiyama

[11] Patent Number: 4,941,745
[45] Date of Patent: Jul. 17, 1990

[54] PROJECTION ALIGNER FOR FABRICATING SEMICONDUCTOR DEVICE HAVING PROJECTION OPTICS

[75] Inventor: Shuji Sugiyama, Mito, Japan

[73] Assignee: Hitachi, Ltd., Tokyo, Japan

[21] Appl. No.: 291,163

[22] Filed: Dec. 28, 1988

[30] Foreign Application Priority Data

Dec. 30, 1987 [JP] Japan .................. 62-333186

[51] Int. Cl.$^5$ ........................... G01B 11/00
[52] U.S. Cl. ................... 356/401; 250/548
[58] Field of Search ............ 356/399, 400, 401; 250/548; 355/53

[56] References Cited

FOREIGN PATENT DOCUMENTS 59-13324 1/1984 Japan .
61-114599 6/1986 Japan .

Primary Examiner—F. L. Evans
Attorney, Agent, or Firm—Antonelli, Terry, Stout & Kraus

[57] ABSTRACT

A projection aligner having a projection optics which project circuit patterns of reticles on a wafer next by step, comprising an X-Y stage mounting the wafer and moved to an X or Y direction by a stage controller, a developer for developing an alignment mark projected on the wafer by the projection optics, an alignment mark detector being disposed on the projection optics, and a correcting arrangement for an offset error of the alignment mark detector by measuring the offset error of a zero point after the wafer is projected with an alignment mark by the projection optics, the alignment mark is developed by the developer and the developed alignment mark on the wafer is moved to is detection area which is previously set based on design data keeping the wafer fixed on the X-Y stage. The offset error is measured as moving distance of X-Y stage and adjust the stage controller or zero point of the alignment mark detector in order to project actual circuit patterns on the wafer correctly.

8 Claims, 4 Drawing Sheets

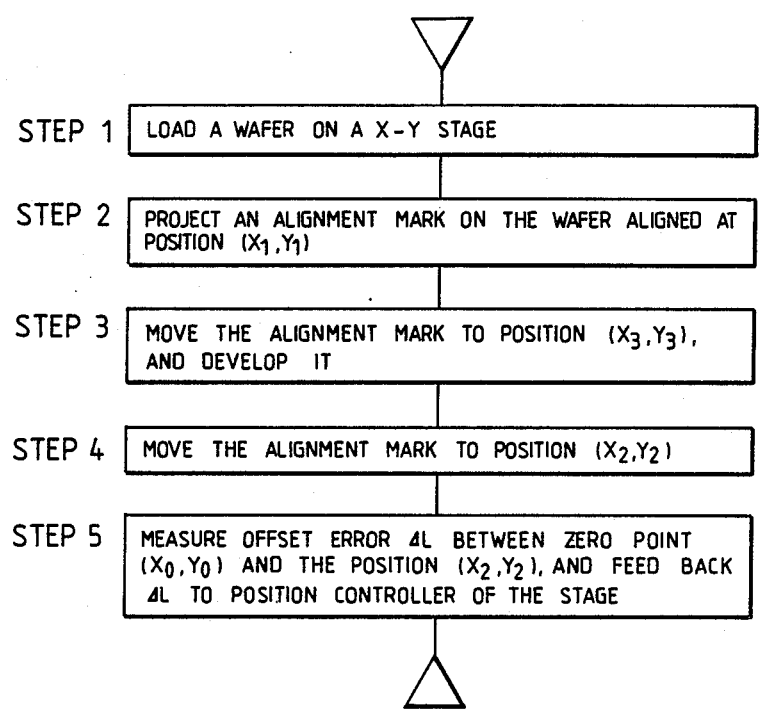

PROJECTION ALIGNER FOR FABRICATING SEMICONDUCTOR DEVICE HAVING PROJECTION OPTICS

BACKGROUND OF THE INVENTION

This invention relates to an optical projection aligner for forming circuit patterns on a semiconductor wafer, and more particularly to an aligner having a projection optics with an alignment mark detector which is correctly set at a zero point thereof.

When forming a circuit pattern on a wafer, each pattern of many reticles is projected and developed on the wafer one by one, by using a reduction projection aligner. In each projection of the every reticle patterns on the wafer, a relative alignment between the wafer and a projection optics of the reduction projection aligner is needed.

Generally, the wafer is aligned and fixed on an X-Y stage by using an alignment mark detector set up on the projection optics and detecting an alignment mark thereby on the wafer which is formed in a former process of the projection and the development of the wafer. That is to say, the X-Y stage mounting the wafer is automatically moved so as to correspond the alignment mark on the wafer with the zero point of the alignment mark detector which is the center of the detection area.

By the way, the zero point of the alignment mark detector shifts from a correct position, for example, when a positional drift between the alignment mark detector and the projection optics occurs because of the temperature change. When the zero point shift occurs, an offset error arises between every pattern projecting onto the wafer in spit of the correspondence of the alignment mark of the wafer to the zero point.

Therefore, the X-Y stage is controlled to correct the offset error calculated from a gap between the patterns on the wafer by observing the gap in experimental projections on the wafer using an electron microscope or other measuring equipment before actual projections of real patterns.

Japanese Laid-open Patent No. 59-13324 is cited as an example of such prior art concerning offset error correction.

Furthermore, Japanese Laid-open Patent No. 61-114529 shows a system to detect a latent image of the alignment mark on the wafer which is projected from the reticle. The latent image is formed by only projecting of the alignment mark of the reticle and have a different refractive index from that of other part which is not projected the alignment mark. But the detected latent image is not clear because it is not developed. Therefore, there still remains a problem in a practical use of the above stated detecting system.

SUMMARY OF THE INVENTION

In the conventional system stated above, offset error of the zero point of the alignment mark detector set on the projecting optics is at the same time corrected with a positional setting error of the stage, error of the measuring equipment and so on. But the calculation of the offset error and feeding back thereof to a controller of the X-Y stage by using the conventional system take much time and are very troublesome. Furthermore, as there is not so good measuring equipment having high measuring accuracy, it is difficult to get enough accuracy needed as the projection aligner.

The present invention has been accomplished to overcome the above mentioned problem.

An object of the present invention is in minimizing the time for the calculation of the offset error and the feed back control of the offset error to the controller. The other object of the invention is in obtaining an improved projection aligner having sufficient accuracy.

In the present invention, the inventor has had an idea to remove the offset error of the zero point of the alignment mark detector corresponding to the wafer position, before starting of the projection of the patterns onto the wafer.

The offset error arises because a relative positional drift between the projection optics which projects the alignment mark on the wafer and the detector which detects the alignment mark arises because of the temperature change in the reduction projection aligner for a long time.

The present invention is characterized in that keeping the wafer fixed on the stage, the projection optics projects the alignment mark on the wafer and the X-Y stage is moved to a developer for developing the alignment mark on the wafer; that further the X-Y stage is moved so as to correspond the developed alignment mark to the zero point of the alignment mark detector; and that after measuring the moved distance of the X-Y stage from the position of the stage where the alignment mark is projected, to the position of the stage where the alignment mark is detected, and the offset error of zero point is calculated from the moved distance of the X-Y stage.

After correcting the offset error of the zero point of the projection optics which equips the alignment mark detector corresponding to the X-Y stage mounting the wafer, each circuit pattern of every reticle is projected on the wafer and developed by detecting the alignment mark using the accurate projection optics. Therefore, the circuit pattern on the wafer is formed not only very efficiently but very accurately.

BRIEF DESCRIPTION OF THE DRAWINGS

FIG. 4 is a flow chart showing the operation of the projection aligner in the present invention.

DETAILED DESCRIPTION OF THE PREFERRED EMBODIMENTS

Figure 1:
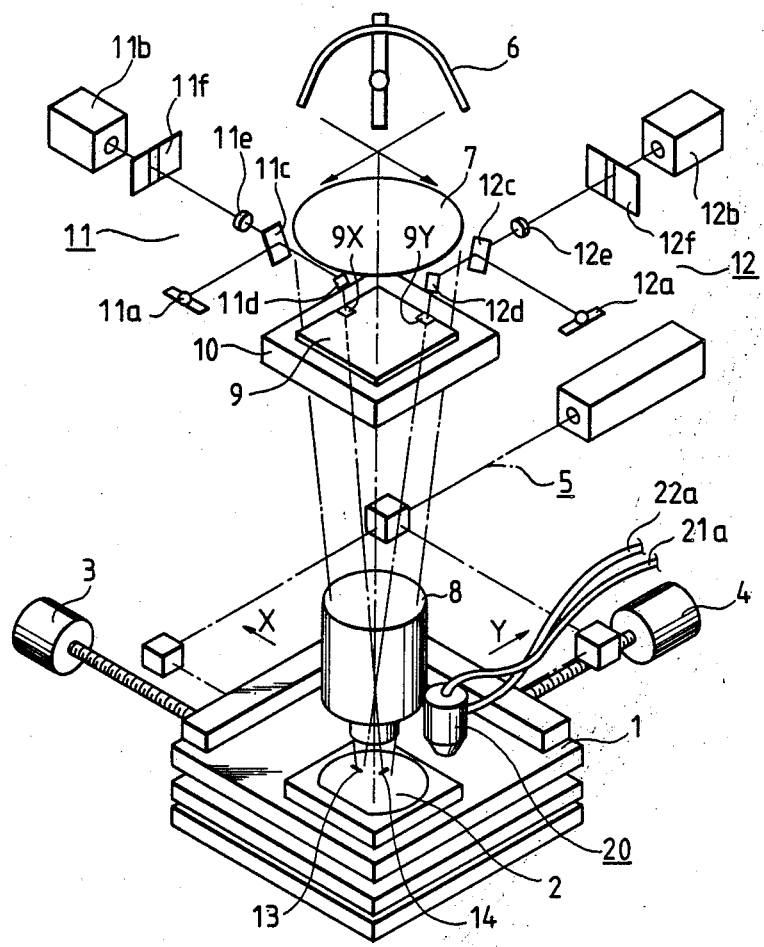
FIG. 1 is a schematic view of an embodiment of a total system applied to the present invention.

Turning now to FIG. 1 which shows an embodiment of the projection aligner in the present invention, 1 is an X-Y stage mounting a wafer 2, and 3 and 4 are position controllers of the X-Y stage such as servomotors.

The positions of the X-Y stage in the X and Y direction thereof are measured by a laser measurement system 5. Projection optics consists of an illuminator 6, a condenser lens 7, a projection lens 8 and a reticle 9 which is formed a circuit pattern therein and moved slightly by a fine adjustment means 10. An alignment mark detector 11 detects an alignment mark 13 which shows the position of the reticle 9 in the X direction and an alignment mark detector 12 detects an alignment mark 14 which shows the position of the reticle in the Y direction. The alignment marks 13 and 14 are projected from the reticle 9 to the wafer 2 and developed. The alignment mark detectors 11 and 12 are set up on the projection optics, and detect the alignment mark holding a certain positional relation with the projection optics. Each optical system of the alignment detectors 11 and 12 consists of lamps 11a, 12a for projecting the alignment marks, light detectors 11b and 12b, half mirrors 11c and 12c, mirrors 11d and 12d, lenses 11e and 12e and slits 11f and 12f having a zero point in the center thereof which is detected by the detector 11b and 12b.

The projection light beam from the illuminator 6 passes through the condenser lens 7, the reticle 9 and the projection lens 8 and reaches the wafer 2, and the pattern of the reticle 9 is projected on the wafer to be developed.

The position of the X-Y stage 1 is measured by the laser measurement system 5 with high accuracy better than about ±0.02 μm, and moved slightly in the X or Y direction with an accuracy about ±0.05 μm by the servomotors 3 or 4. The alignment mark detectors 11 and 12 detect the alignment marks 13 and 14 through windows 9X and 9Y on the reticle 9 and the projection lens 8 with an accuracy ±0.1 μm. The patterns of many reticles are projected on the wafer 2 with a high accuracy.

The alignment mark detectors 11, 12 detect the alignment marks 13, 14, the servomotors 3, 4 move the X-Y stage until the alignment marks 13, 14 coincide with the zero point of the slits 11f, 12f, and the relative positional relation between the reticle 9 and the wafer is set up. The zero point of the detectors 11, 12 means the center of detection area of the detectors 11, 12 which is determined by slits 11f, 12f.

Furthermore, in the embodiment of the present invention, a developer 20 is set up on the projection aligner as stated above. The developer 20 is disposed near the X-Y stage and at an upper position of the X-Y stage, and the wafer 2 fixed on the X-Y stage is moved with the X Y stage towards the developer 20 until the alignment marks 13, 14 projected on the wafer are positioned under the developer 20.

Figure 2:
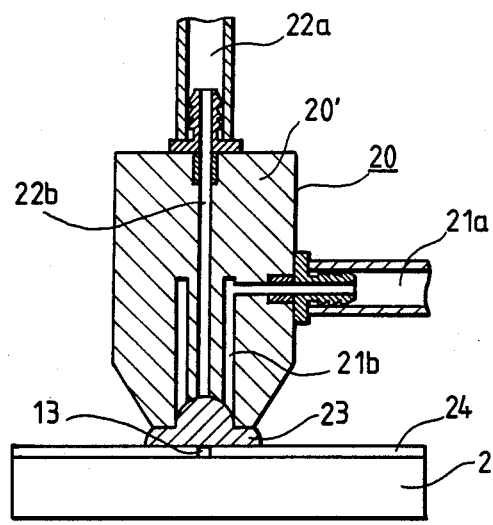
FIG. 2 is a sectional view of a developer in FIG. 1.

FIG. 2 shows a cross-sectional view of the developer 20. In FIG. 2, a tube 21a is connected to the nozzle 21b formed in the developer's body 20' and supplies developing liquid 23 and rinse liquid. A suction tube 22a is connected to a suction nozzle 22b and sucks in the developing liquid 23 and then rinse liquid. On photoresist 24 on the wafer 2, a small amount of the developing liquid 23 is poured from the nozzle 21b and covers the portion 13 of photoresist 24 on the wafer which is projected as the alignment mark. The developing liquid 23 on the photoresist 24 does not spread because of its surface tension. After the alignment mark 13 is developed by the developing liquid 23, the liquid 23 is sucked by the suction nozzle 22b, and the rinse liquid is supplied on the alignment mark 13 from the nozzle 21b and sucked from the suction nozzle 22b. Then the alignment mark is dried by air supplied from the nozzle 21b. When the nozzle 21b supplies the air, the tube 21a is switched so as to be connected to an air tank which is not shown in FIG. 2.

Therefore, the alignment mark 13 is developed and rinsed without taking off the wafer 2 from the X-Y stage 1 as the X-Y stage 1 carries the portion of the wafer which is projected the alignment mark 13, 14 from the position where the alignment mark is projected, to the position just under the developer where the alignment mark is developed and rinsed keeping the wafer 2 fixed on the X-Y stage 1.

Figure 3:
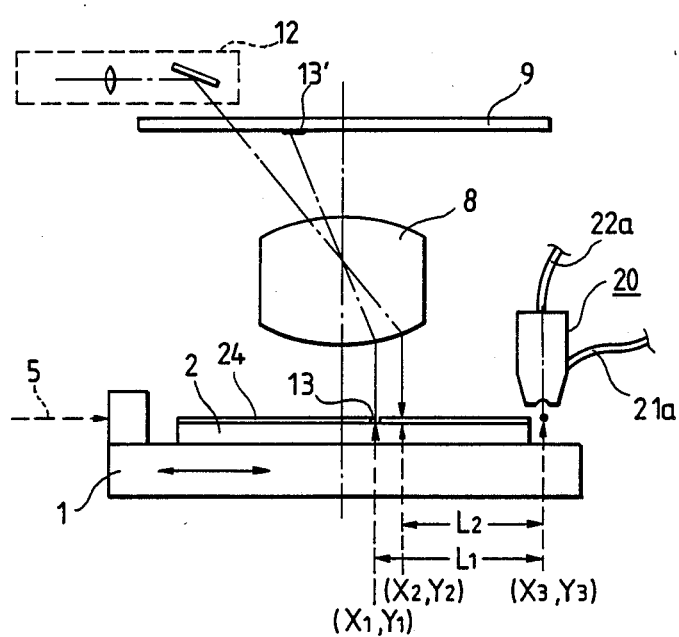
FIG. 3 is a schematic diagram of the projection optics in the present invention.
Figure 5A:
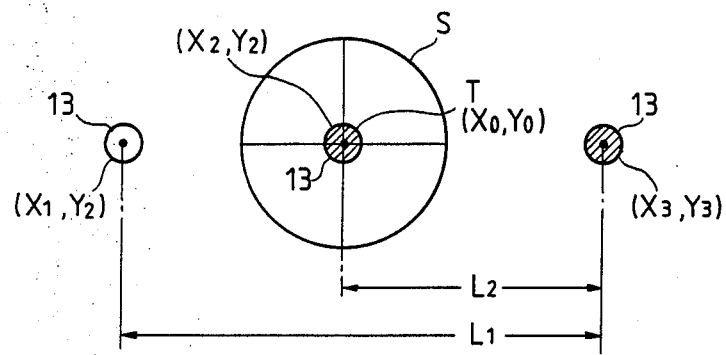
FIG. 5(a) and FIG. 5(b) are schematic diagrams showing the motion of the X-Y stage mounting the wafer in the present invention.
Figure 5B:
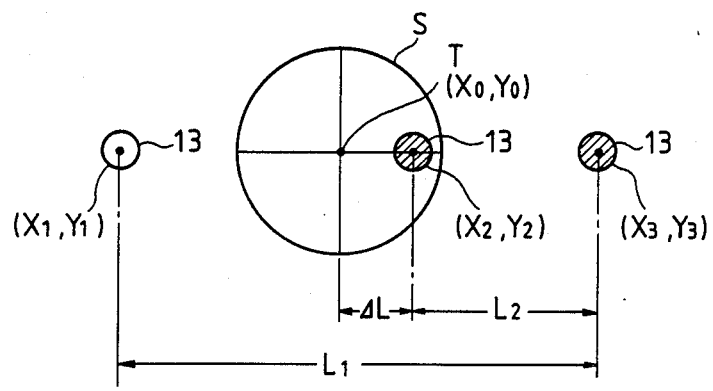

FIG. 3 is a schematic diagram showing how to correct the offset error of the zero point of the projection optics, FIG. 4 is a flow chart showing the above operation in FIG. 3. FIG. 5(a) and FIG. 5(b) are schematic diagrams showing the relative movement between the projection optics and the X-Y stage keeping the wafer 2 fixed thereon.

The offset error correction of the zero point in the embodiments of the present invention is previously taken place before the circuit patterns of the reticles are projected on the wafer 2.

At first, the wafer 2 which is not yet developed is loaded to be fixed on the X-Y stage (step 1). The projection optics projects the alignment mark of the reticle 9 on a certain position $(X_1, Y_1)$ of the wafer (step 2). Keeping the wafer fixed on the X-Y stage 13, the X-Y stage 1 carries the projected alignment mark on the wafer 2 to the position $(X_3, Y_3)$ just under the developer 20, and the projected potion is developed, rinsed and dried (step 3). The distance $L_1$ which the X-Y stage moves from the position $(X_1, Y_1)$ to the position $(X_3, Y_3)$ is measured by the laser measurement system 5 with very high accuracy.

Then, the X-Y stage is moved to the position $(X_2, Y_2)$, where the alignment detectors 11, 12 which are set up on the projecting optics detect the developed alignment mark 13, and the distance $L_2$ from the position $(X_3, Y_3)$ to the position $(X_2, Y_2)$ is measured by the laser measurement system 5 (step IV).

By the way, the positions of the X-Y stage $(X_1, Y_1)$, $(X_3, Y_3)$ and $(X_2, Y_2)$ are already known as design data calculated by the designer of the projection aligner and memorized in a memory of the projection aligner. Based on the design data of the position $(X_1, Y_1)$, $(X_3, Y_3)$ and $(X_2, Y_2)$, the X-Y stage 1 is moved from the position $(X_1, Y_1)$ to the position $(X_3, Y_3)$ and from the position $(X_3, Y_3)$ to the position $(X_2, Y_2)$. When the X-Y stage is moved to the position $(X_2, Y_2)$ and if the alignment mark 13 is found at the zero point of the alignment detector 11, 12 which is the center of the detection area of the detector, there is not any offset error in the projection optics and if the alignment mark 13 is not found at the zero point, there is some offset error in the projection optics (step 5).

As shown in FIG. 5(a), the wafer 2 on the X-Y stage 1 is projected with the alignment mark and is developed, and the developed alignment mark is detected by the alignment mark detectors 11, 12 while the X-Y stage 1 is moved from $(X_1, Y_1)$ to $(X_3, Y_3)$ and then from $(X_3, Y_3)$ to $(X_2, Y_2)$ based on the design data which are already known. If the alignment mark 13 developed at the position $(X_3, Y_3)$ is found at the zero point T of the detector 11, there is not any offset error in the alignment optics, and there is no need to correct the zero point.

But, as shown in FIG. 5(b), the X-Y stage 1 is moved to the position $(X_1, Y_1)$ according to the design data and the wafer 2 on the X-Y stage 1 is projected. Then, the X-Y stage 1 is moved the distance $L_1$ from $(X_1, Y_1)$ to $(X_3, Y_3)$ according to the design data and the projected portion of the wafer 2 is developed. And, then the X-Y stage is moved the distance $L_2$ from $(X_3, Y_3)$ to $(X_2, Y_2)$ according to the design data keeping the wafer fixed on the X-Y stage. Now, if the alignment mark 13 is detected apart from the zero point T which is the center $(X_0, Y_0)$ of the detection area S of the detector 11, there is an offset error in the alignment optics. In this case, the difference ΔL between the center ($X_0$, $Y_0$) and the position ($X_2$, $Y_2$) is the offset error. This offset error is calculated by measuring a moved distance of the X-Y stage from the position ($X_2$, $Y_2$) to the center ($X_0$, $Y_0$) by detecting the alignment mark 13 with the alignment mark detector 11. ΔL is memorized in the memory (not shown in FIG. 1) of the projection aligner and is adoptively used to control the position controller 3 in order to move the wafer on the X-Y stage so as to enables the circuit pattern of the reticle to be provided at the correct position ($X_1$, $Y_1$).

By the way, instead of the correction of the position control of the wafer, ΔL is used to correct the relative positional relation between the projection optics and the alignment mark detector by adjusting the zero point of the alignment mark detector so as to find the alignment mark at the center ($X_0$, $Y_0$) of the detection area S of the detector 11.

In the above-mentioned embodiment of the present invention, how to correct the offset error in X direction is shown, but, correction of the offset error in Y direction is attained in the same manner as above.

Furthermore, the offset error ΔL is detected by measuring the position of the alignment mark in the alignment mark detector, and the zero point of the mark detector is corrected by adjusting the zero point according to the offset error ΔL.

I claim:

1. A projection aligner for fabricating a semiconductor device having a projection optics which projects a circuit pattern of a reticle on a wafer comprising:
    an X-Y stage for mounting the wafer thereon,
    a stage controller for moving the X-Y stage to an X or Y direction,
    developing means for developing an alignment mark on the wafer projected by the projection optics,
    an alignment mark detector set on the projection optics for detecting the alignment mark,
    correction means for correcting a relative positional relation between the alignment mark detector and the projection optics by measuring an offset error with respect to a zero point of the alignment mark detector, after the alignment mark is projected on the wafer by the projection optics, is moved to the developing means so as to be developed by the developing means, is moved to a previously set position and is detected by the alignment mark detector while keeping the wafer fixedly mounted on the X-Y stage.

2. A projection aligner as defined in claim 1, wherein said developing means is disposed over the X-Y stage.

3. A projection aligner as defined in claim 1, wherein the offset error is detected as a moving distance of the X-Y stage and is fed back to adjust the stage controller.

4. A projection aligner as defined in claim 3, wherein said developing means is disposed over the X-Y stage.

5. An projection aligner as defined in claim 1, wherein the offset error is measured as the difference between said position which is previously set and a real position of the X-Y stage when the alignment mark is detected at the zero point of the alignment mark detector, and is fed back to adjust the stage controller.

6. A projection aligner as defined in claim 5, wherein said developing means is disposed over the X-Y stage.

7. A projection aligner as defined in claim 1, wherein the offset error is measured as moving distance of the X-Y stage and is fed back to adjust the zero point of the alignment mark detector.

8. A projection aligner as defined in claim 7, wherein said developing means is disposed over the X-Y stage.

* * * * *